United States Patent
Man et al.

(10) Patent No.: US 8,276,028 B2
(45) Date of Patent: *Sep. 25, 2012

(54) USING ERROR INFORMATION FROM NEARBY LOCATIONS TO RECOVER UNCORRECTABLE DATA IN NON-VOLATILE MEMORY

(75) Inventors: Chun Fung Man, Vancouver (CA); Jonathan E. Schmidt, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 897 days.

This patent is subject to a terminal disclaimer.

(21) Appl. No.: 12/283,861

(22) Filed: Sep. 16, 2008

(65) Prior Publication Data

US 2009/0292970 A1   Nov. 26, 2009

Related U.S. Application Data

(60) Provisional application No. 61/128,677, filed on May 23, 2008.

(51) Int. Cl.
*G11C 29/00* (2006.01)

(52) U.S. Cl. ........ 714/721; 714/763; 714/746; 714/764; 714/768; 714/773; 714/774; 365/185.01; 365/185.09; 365/185.18; 365/185.2; 365/185.24

(58) Field of Classification Search .................. None
See application file for complete search history.

(56) References Cited

U.S. PATENT DOCUMENTS

| | | | |
|---|---|---|---|
| 4,691,319 A | 9/1987 | Bose et al. | |
| 5,048,023 A | 9/1991 | Buehler et al. | |
| 5,532,962 A | 7/1996 | Auclair et al. | |
| 6,418,051 B2 * | 7/2002 | Manstretta et al. | 365/185.09 |
| 7,280,415 B2 | 10/2007 | Hwang et al. | |
| 7,437,641 B1 * | 10/2008 | Gorshe | 714/732 |
| 7,568,135 B2 | 7/2009 | Cornwell et al. | |
| 7,616,484 B2 * | 11/2009 | Auclair et al. | 365/185.09 |
| 7,639,542 B2 | 12/2009 | Cornwell et al. | |
| 7,773,022 B2 | 8/2010 | Cornwell et al. | |
| 7,788,553 B2 | 8/2010 | Chow et al. | |
| 7,839,685 B2 * | 11/2010 | Auclair et al. | 365/185.09 |
| 7,852,690 B2 | 12/2010 | Cornwell et al. | |
| 7,859,908 B2 | 12/2010 | Cornwell et al. | |
| 7,881,108 B2 | 2/2011 | Cornwell et al. | |
| 7,911,834 B2 | 3/2011 | Cornwell et al. | |
| 7,974,132 B2 | 7/2011 | Cornwell et al. | |
| 8,000,134 B2 * | 8/2011 | Cornwell et al. | 365/185.03 |
| 2008/0077842 A1 | 3/2008 | Gonzalez et al. | |
| 2008/0168320 A1 | 7/2008 | Cassuto et al. | |
| 2008/0320366 A1 | 12/2008 | Lin | |
| 2009/0132758 A1 | 5/2009 | Jiang et al. | |

(Continued)

OTHER PUBLICATIONS

Eli Lusky et al., "NROM Technology", Excerpt from IEEE book on NVM Technologies, Jun. 2007, pp. 1-40.

(Continued)

*Primary Examiner* — John Trimmings

(74) *Attorney, Agent, or Firm* — Christopher K. Gagne

(57) ABSTRACT

In various embodiments, the reference voltage used for read operations in a non-volatile memory may be adjusted up or down in an attempt to read data from an area that previously produced at least one uncorrectable error. The direction and amount of this adjustment may be based on the number and direction of correctable errors in surrounding data.

22 Claims, 5 Drawing Sheets

U.S. PATENT DOCUMENTS

| | | | |
|---|---|---|---|
| 2009/0132895 | A1 | 5/2009 | Jiang et al. |
| 2009/0144600 | A1 | 6/2009 | Perlmutter et al. |
| 2009/0210771 | A1 | 8/2009 | Yang et al. |
| 2009/0292969 | A1 | 11/2009 | Man et al. |
| 2009/0292971 | A1 | 11/2009 | Man et al. |
| 2009/0323418 | A1 | 12/2009 | Cornwell et al. |
| 2010/0070798 | A1 | 3/2010 | Cornwell et al. |
| 2011/0099438 | A1* | 4/2011 | Gonzalez et al. ............. 714/721 |
| 2011/0170348 | A1 | 7/2011 | Cornwell et al. |

OTHER PUBLICATIONS

"Adjustable Read Reference for Non-Volatile Memory", Filed on Sep. 16, 2008.

Office Action received for U.S. Appl. No. 12/288,617, mailed on Nov. 8, 2011, 13 pages.

Response to Office Action received for U.S. Appl. No. 12/288,617, filed on Apr. 6, 2012, 12 pages.

Response to Office Action received for U.S. Appl. No. 12/288,617, filed on Jan. 13, 2012, 10 pages.

Office Action received for U.S. Appl. No. 12/283,832, mailed on Apr. 3, 2012, 13 pages.

Response to Office Action received for U.S. Appl. No. 12/283,832, filed on Feb. 27, 2012, 10 pages.

Office Action received for U.S. Appl. No. 12/283,832, mailed on Dec. 8, 2011, 14 pages.

Office Action received for U.S. Appl. No. 12/288,617, mailed on Feb. 2, 2012, 13 pages.

Office Action received for U.S. Appl. No. 12/288,617, mailed on Apr. 20, 2012, 14 pages.

* cited by examiner

E↓ = 8
E↑ = 3
---
DIFFERENCE = 5 ↓

FIG. 3

FIRST READ:

REREAD AFTER REFERENCE MOVE:

USING ERROR INFORMATION FROM NEARBY LOCATIONS TO RECOVER UNCORRECTABLE DATA IN NON-VOLATILE MEMORY

CROSS-REFERENCE TO RELATED APPLICATIONS

This application is related to U.S. provisional application Ser. No. 61/128,677, filed May 23, 2008, and claims priority to that date for all applicable subject matter.

BACKGROUND

Some types of non-volatile memory, such as flash memory, record binary data by storing a certain amount of charge in a memory cell. When the data is read, the voltage level of the stored charge is compared to a reference voltage. The binary value of the bit read from that cell will depend on whether the voltage of the stored charge is higher or lower than the reference voltage. However, since the stored charge is an analog phenomenon, its actual value may not be exactly what was intended, and it may even leak away over time, so this type of non-volatile memory is subject to errors when reading the data stored in the memory. When such errors occur while reading sequential data from the memory, an error checking and correction (ECC) process may be used to detect and hopefully correct the errors. But some errors may even be uncorrectable with the ECC. Whether a particular error is correctable at the tine or not, this degradation in the reliability of the memory is an ongoing problem. This type of problem may become even more widespread as flash memories move increasingly to smaller geometries and to multiple-bits-per-cell structures, which have less tolerance for variation in the stored charge.

BRIEF DESCRIPTION OF THE DRAWINGS

Some embodiments of the invention may be understood by referring to the following description and accompanying drawings that are used to illustrate embodiments of the invention. In the drawings:

FIG. 3 shows the errors obtained from reading a sector of data, according to an embodiment of the invention.

DETAILED DESCRIPTION

Figure 1:
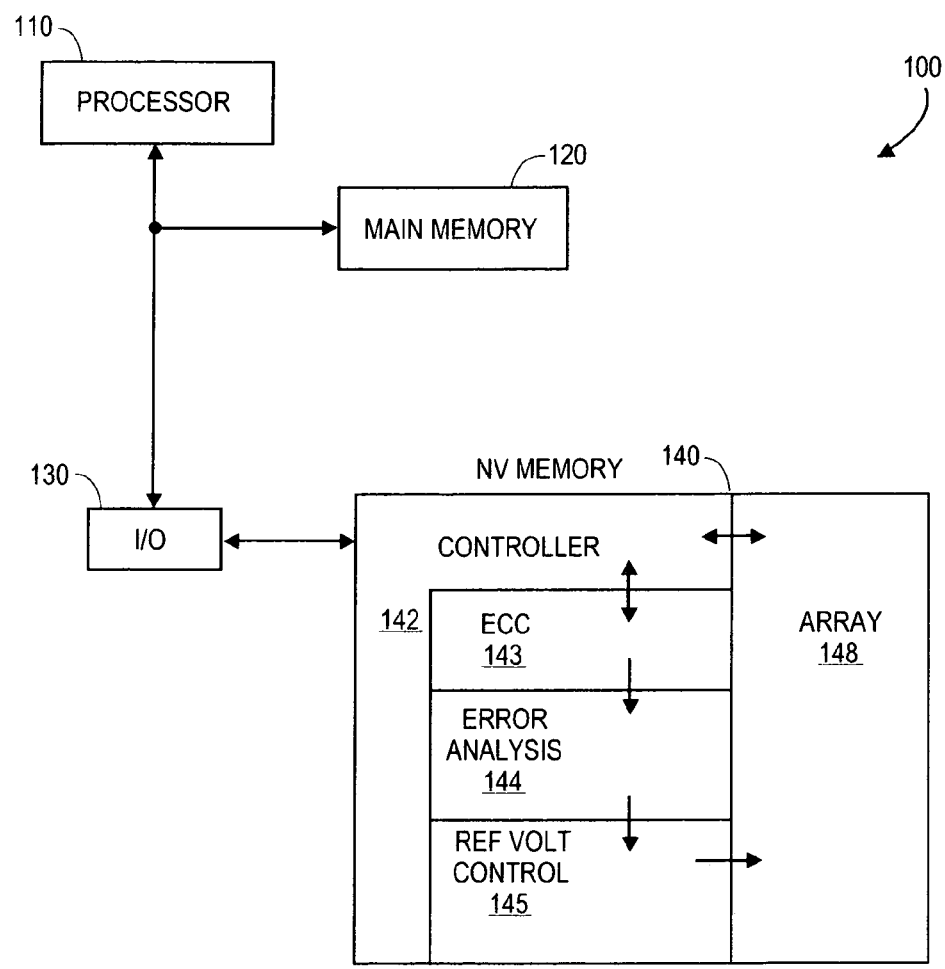
FIG. 1 shows a system containing a non-volatile memory, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a computer-readable medium, which may be read and executed by one or more processors to enable performance of the operations described herein. A computer-readable medium may include any mechanism for storing, transmitting, and/or receiving information in a form readable by one or more computers. For example, a computer-readable medium may include a tangible storage medium, such as but not limited to read only memory (ROM); random access memory (RAM); magnetic disk storage media; optical storage media; a flash memory device, etc. A computer-readable medium may also include a propagated signal which has been modulated to encode the instructions, such as but not limited to electromagnetic, optical, or acoustical carrier wave signals.

In various embodiments, the reference voltage used for read operations in a non-volatile memory may be adjusted up or down in an attempt to read data from an area that previously produced uncorrectable errors. The direction and amount of this adjustment may be based on the direction and net quantity of correctable errors within an address range. The 'direction' of an error pertains to whether the voltage in the data cell was higher than the reference voltage when it should have been lower, or lower than the reference value when it should have been higher. The 'net quantity' of errors pertains to the difference between the total number of errors in one direction and the total number of errors in the other direction. The 'address range' pertains to a range of sequential addresses (e.g., all the sectors in a page). This type of adjustment may be particularly useful in those types of memory (e.g., NAND flash memory) in which the cause of some types of errors may be localized, e.g., most of the correctable and non-correctable errors throughout a single page may be created by the same error source.

FIG. 1 shows a system containing a non-volatile memory, according to an embodiment of the invention. The illustrated system 100 comprises a processor 110, a main memory 120, input-output logic 130, and a non-volatile (NV) memory 140. In this particular implementation, the NV memory is attached as an I/O device (such as but not limited to a solid-state disk), but other embodiments may place the NV memory elsewhere in the system (such as but not limited to a part of the main memory itself, a cache memory working in cooperation a hard disk drive, etc.). Various embodiments of the invention should be usable in diverse applications, and in different parts of a system, whether or not those applications and parts are specifically described here.

The NV memory may employ any feasible type of NV storage technology that uses an adjustable reference voltage for read operations. It may be particularly useful in NV memory that reads an entire range of sequential memory locations with a single read command (such as but not limited to reading a page of memory from a NAND flash memory array), rather than reading an individual byte or word with a single read command.

In the illustrated embodiment of FIG. 1, NV memory 140 may comprise a storage array 148 and a controller 142 to control operations with the array such as read, write, erase, and adjustment of reference voltages. The controller 142 may be further separated into other functional units, such as error checking and correction (ECC) unit 143, error analysis unit 144, and reference voltage control unit 145. Although these units are shown as separate functional units, two or more of them may share common physical circuitry and/or code.

Whenever the controller 142 receives a read request from the processor 110 or other device, the controller may initiate an operation that reads data from multiple sequential storage locations in the array. The starting address of the locations may be indicated by the read request, while the number of locations may be specified in the request or may be predefined in some other manner. As the data is read and placed in a buffer, the ECC unit may detect any errors in the data, keep track of those errors, and correct the errors that it is able to correct through its error-correction algorithm. After reading the desired quantity of data (such as a page of data, though other sizes may be used), the correctable errors may be analyzed to determine how many 0-to-1 errors occurred and how many 1-to-0 errors occurred. If the number of errors in one direction exceeds the number of errors in the other direction by a predefined amount, the reference voltage that was used for the read operation may be adjusted by the Reference Voltage Control unit in an attempt to correct the cause of these errors. Future read requests may repeat this entire process, so the reference voltage may be adjusted again as circumstances indicate.

Figure 2A:
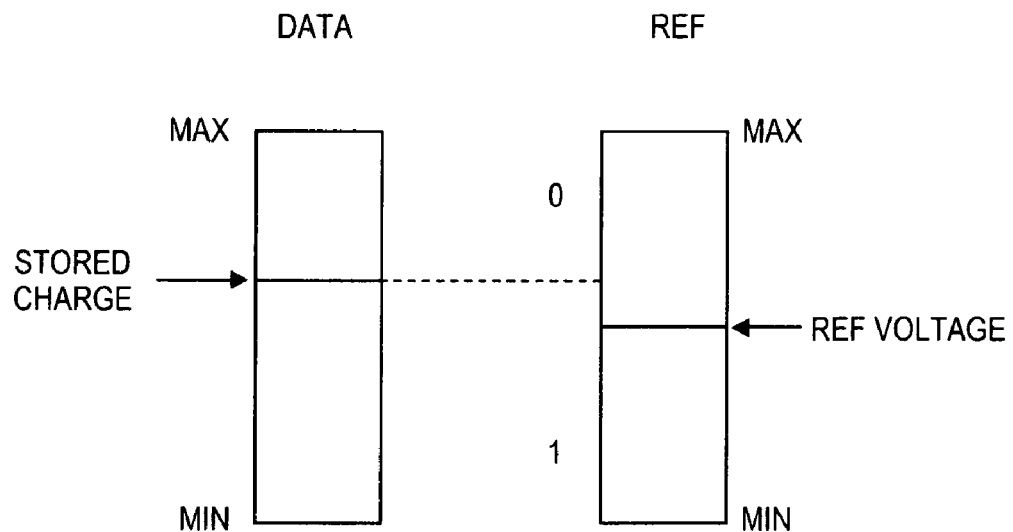
FIGS. 2A and 2B show bar charts indicating the charge in a single data cell compared to the reference voltage, according to an embodiment of the invention.
Figure 2B:
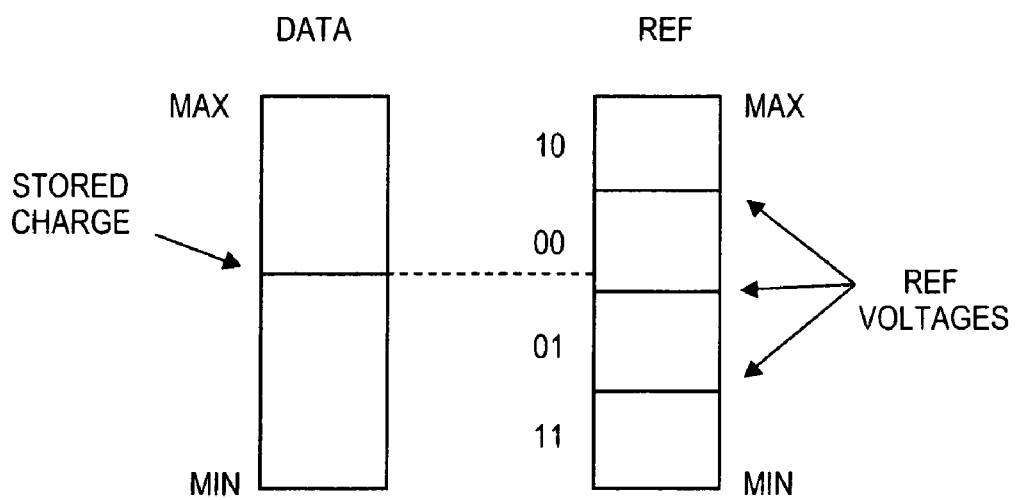

FIGS. 2A and 2B show bar charts indicating the charge in a single data cell compared to the reference voltage, according to an embodiment of the invention. FIG. 2A shows a single-bit-per-cell (SBC) configuration, in which a single binary bit is stored in each data cell. The reference voltage may be set at the factory to a value somewhere between the minimum and maximum values shown, but may later be adjusted by the memory controller during operation of the memory in its intended field of use.

When writing data to the data cell (or when erasing the data cell), the stored charge in the data cell may be set to various values between the minimum and maximum values. During a read operation, a voltage comparator may be used to compare the voltage of the stored charge in the data cell with the reference voltage. If the voltage in the data cell is greater than the reference voltage, the cell may be considered to contain a binary '0'. Alternatively, if the voltage in the data cell is less than the reference voltage, the cell may be considered to contain a binary '1'. (Note: in some embodiments, this assignment of binary value to voltage range may be reversed, so that a voltage higher than the reference voltage would represent a '1', and lower than the reference voltage would represent a '0'. Assigning different voltage ranges to different binary values in this manner is well known in the art.)

As long as the voltage in the data cell and the reference voltage are not too close to each other in value, the voltage comparator should be able to make a non-ambiguous reading from the cell. However, charge leakage or other phenomena can cause the data voltage and the reference voltages to get too close to each other, or may even cause one voltage to end up on the wrong side of the other voltage, resulting in an error when the cell is read. As previously stated, some errors may be corrected by implementing an ECC algorithm on the data read from multiple cells, provided the errors are not too numerous. Those errors that are not correctable by the ECC algorithm are labeled as uncorrectable errors in this document, even if the correct data may be obtained subsequently in other ways.

FIG. 2B shows a multiple-bits-per-cell (MBC) configuration, in which a single data cell may be used to store multiple binary bits. In this particular example, three reference voltages are used to divide the potential voltage range into four parts, with each part representing a different two-bit combination, although other MBC embodiments may use other quantities of reference voltages and bits per cell. In some embodiments, each of the reference voltages is stored separately, so that each can be adjusted without affecting the others. If the voltage of the stored charge in the data cell falls within one of the four indicated parts, it represents the two-bit binary value associated with that part. The particular two bit combinations shown in FIG. 2B use a Gray code, so that only one binary bit changes when transitioning across any reference voltage. However, any other assignment of multi-bit codes to each range is also possible. Although a 4-part, 3-reference voltage example is shown, other embodiments may store more bits in each data cell by using more reference voltages (e.g., 8-parts with 7-reference voltages to store three bits per cell).

The MBC technique of FIG. 2B differs from the SBC technique of FIG. 2A in at least two ways: 1) each multi-bit combination falls within a smaller range of voltages, so that it is easier for the stored charges to get into an error condition, and 2) errors cannot be characterized simply as a 0-to-1 transition or a 1-to-0 transition, since the associated bit patterns are more complicated than that. Therefore, such transitions will subsequently be described herein as an 'increased value error' or a 'decreased value error', and these terms will be applied to both SBC and MBC memory types. An 'increased value error' indicates that the voltage level in the data cell was higher than the associated reference voltage when it should have been lower than that reference voltage, a problem that may sometimes be corrected by increasing the reference voltage for subsequent reads. Similarly, a 'decreased value error' indicates that that the voltage level in the data cell was lower than the associated reference voltage when it should have been higher than that reference voltage, a problem that may sometimes be corrected by decreasing the reference voltage for subsequent reads. For instance, in the example of FIG. 2B, reading a '00' when the correct data was a '01' would be described as an increased value error, because 00 is represented by a higher voltage level than 01 in this configuration. This particular problem may be corrected by increasing the reference voltage that divides the '00' and '01' ranges.

Figure 3:
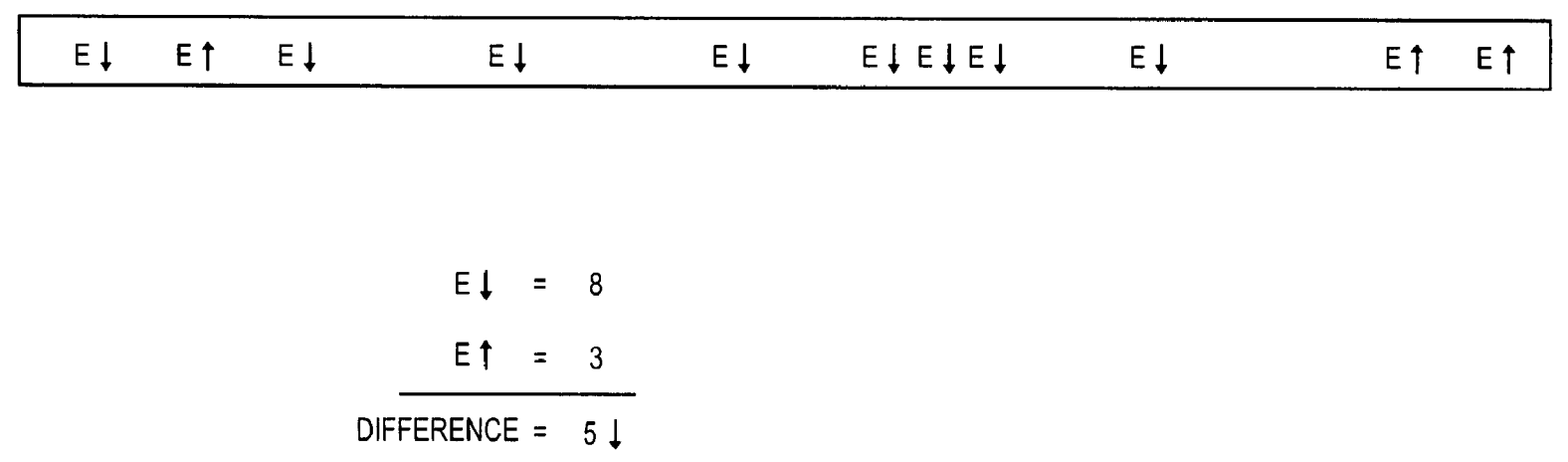

FIG. 3 shows the errors obtained from reading a sector of data, according to an embodiment of the invention. In the illustrated example, after reading the sector, the ECC unit found that eleven bits were read incorrectly, with eight of the errors being decreasing value errors (indicated with a down arrow) and three of them being increasing value errors (indicated with an up arrow), for a net result five decreasing value errors. If the ECC unit finds that all the errors in the sector are correctable, then that sector has been successfully read, and the data read from that sector may be considered correct. If any of the errors in a sector are uncorrectable, then that sector has not been successfully read, and in some embodiments all of the data read from that sector may be considered incorrect. Depending on the codes used in the ECC algorithm, the amount of data considered incorrect due to uncorrectable errors may be larger or smaller than a sector, but sectors are used in the examples described here.

Figure 4A:
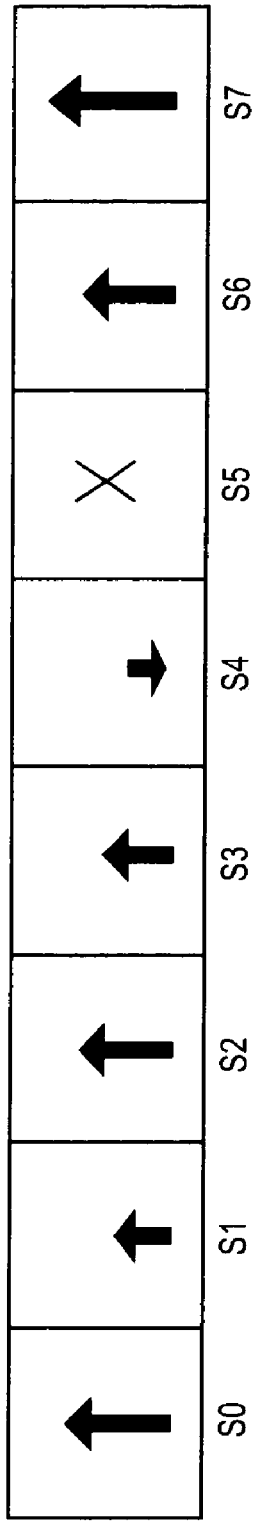
FIGS. 4A and 4B show the results of reading a page of data, according to an embodiment of the invention.
Figure 4B:
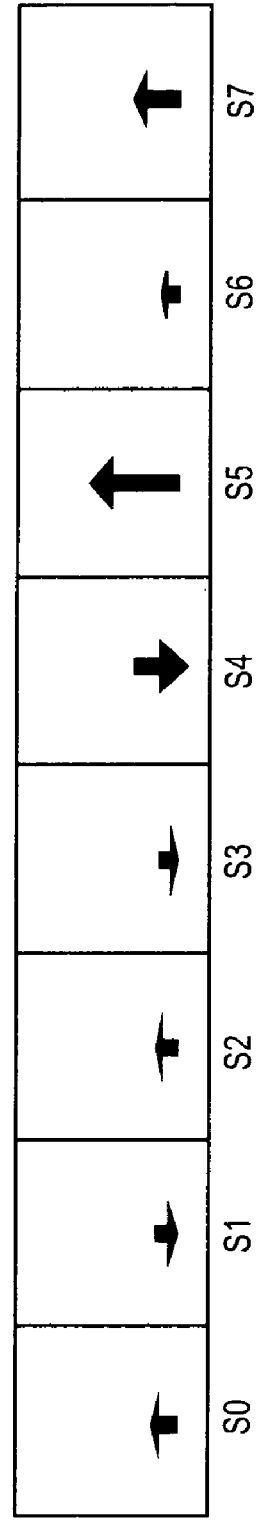

FIGS. 4A and 4B show the results of reading a page of data, according to an embodiment of the invention. In the illustrated embodiment, the page contains eight sectors, and FIG. 4A shows that each sector had errors when the page was first read from the NV memory. The arrow within any given sector is a graphical representation of the result of the error determination process of FIG. 3. The direction of the arrow indicates whether there are more increasing value errors (up arrow), or more decreasing value errors (down arrow). The length of the arrow indicates the net quantity of errors in that sector (e.g., the absolute difference between the number of correctable increasing value errors and the number of correctable decreasing value errors that were found in that sector by the ECC). The X in sector S5 indicates that there was at least one uncorrectable error in that sector, so the data in that sector is considered incorrect. This information about errors could also have been represented numerically in FIG. 4, and would be handled numerically if it was being processed in a computer, but the arrow format was chosen here because it provides a quick visual indication to the reader of the relevant concepts.

In the first read of this particular page, shown in FIG. 4A, the arrows indicate that six of the indicated sectors produced a greater number of increasing rather than decreasing error values, while only sector S4 produced a greater number of decreasing rather than increasing error values. Further, the length of the arrows indicates that most of the errors in this page were of the increasing value error type. Based on this overall result, it may be reasonable to assume that the cause of the errors in sector S5 was so great in the increasing direction, that it exceeded the ability of the ECC unit to correct the errors. It may further be reasonable to assume that increasing the reference voltage that was associated with these errors might bring the cause within a correctable range, so that any errors in that sector in a subsequent read would be correctable.

Based on this assumption, the reference voltage may be increased in value, and the page then read again. The results of this subsequent read are shown in FIG. 4B. Although sector S5 still has errors, these errors are now correctable by the ECC, so the correct data in that sector can be determined. In this particular example, the errors in the other seven sectors are also correctable in FIG. 4B, to that the ECC can produce the correct data for all eight sectors on the subsequent read operation. However, it is possible that changing the reference voltage to make sector S5 readable will cause one or more of the other sectors to produce uncorrectable errors. This problem can be addressed by saving the correct data from the first read, and only using the subsequent read to obtain data for the sector that was initially unreadable.

Figure 5:
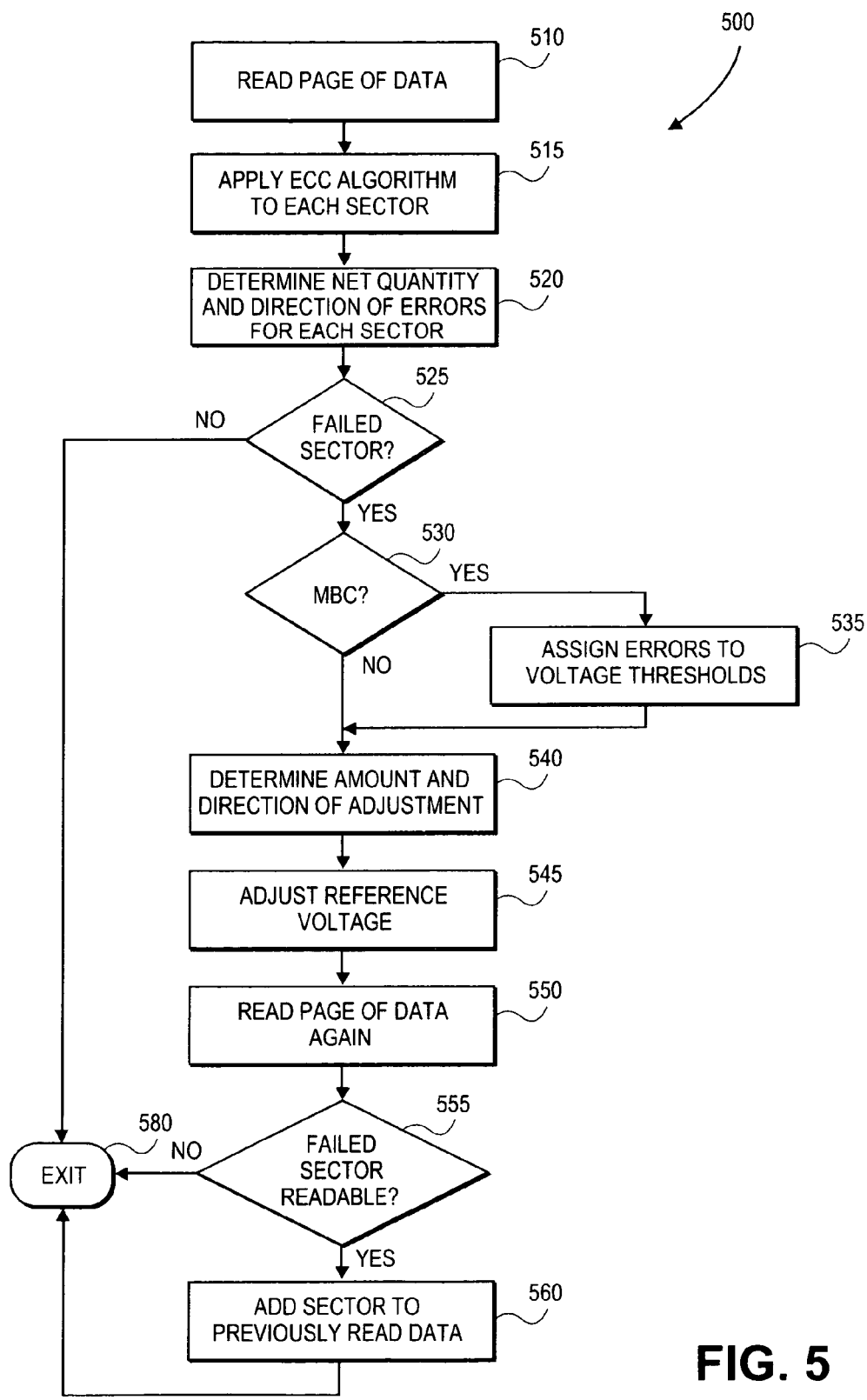
FIG. 5 shows a flow diagram of a method of reading correct data from a non-volatile memory, according to an embodiment of the invention.

FIG. 5 shows a flow diagram of a method of reading correct data from a non-volatile memory, according to an embodiment of the invention. In flow diagram 500, at 510 a page of data may be read from the NV memory, and at 515 an ECC algorithm may be applied to each sector in the data to detect and correct errors in the page. Note: This description is written in terms of a page of memory that is sub-divided into sectors, because those units of data are commonly used in the field of non-volatile memories. However, the same principles may be applied to any block of sequential storage locations that is sub-divided into multiple smaller blocks of sequential storage locations, regardless of the terminology to describe them. Further, this example assumes that the size of the ECC codes permits an entire sector to be considered correct or incorrect, but the same principles may be applied when the size of the ECC codes results in a different amount of data being considered correct or incorrect.

At 520 the correctable errors in each sector may be identified, and a count made of the number of errors in each direction (i.e., increasing value errors or decreasing value errors) for each sector. If there is a sector with uncorrectable errors, that sector is considered a failed sector, and the data in that sector may be considered unreadable. If there are no failed sectors, as determined at 525, then this process may exit at 580. Although there are many other operations that may take place, this flow diagram is focused on what to do when a failed sector is found, so those other operations are not described here.

If a failed sector is found at 525, it may be determined at 530 whether this NV memory used MBC technology. If so, the increasing value errors and decreasing value errors may be further grouped at 535 by the particular reference voltage thresholds that they are associated with, and subsequent operations 540 and 545 may be applied to each reference voltage separately, using only the error values associated with that reference voltage. At 540, parameters may be developed to determine the amount and direction of change that should be applied to the reference voltage, based on the collective error parameters for all the sectors in the page that did not contain uncorrectable errors.

These collective parameters may be derived in various ways. For example, the total value of the errors for all the sectors may be summed (e.g., with decreasing value errors being treated as negative numbers and increasing value errors being treated as positive numbers). This sum may be used to determine how much, and in what direction, to adjust the reference voltage at 545. Alternately, this sum may be divided by the number of non-failed sectors (7 in the example of FIG. 4A), to produce an average amount and direction for correctable errors per sector. This figure may then be used to adjust the reference voltage at 545. Other techniques may also be used to determine the direction and amount of correction to the reference voltage.

After this voltage adjustment has been completed at 545, the entire page may be read again at 550. If the previously-failed sector can now be read accurately (even if it has correctable errors that must be corrected first), as determined at 555, then this correct data from that sector may be added to the correct data from the other sectors that was previously determined, as indicated at 560. However, if the previously-failed sector still has uncorrectable errors, then other measures may be taken by exiting at 580. These other measures are beyond the scope of this flow diagram, but may include things such as but not limited to: 1) repeating the entire process of FIG. 5 to attempt again to read the sector with a different reference voltage, 2) presenting the missing data simply as missing data, 3) marking the sector as a bad sector that is not to be used again, 4) using a more robust error correction technique to attempt to recover the data, 5) etc.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. An apparatus, comprising
a non-volatile (NV) memory, the NV memory comprising
a memory controller to control reading a memory array, the controller to perform operations comprising:
using a first reference voltage to read, from the memory array, data comprising multiple units of data;
performing an error checking and correction process on the data;
determining that at least one of the units contains an uncorrectable error;
determining a direction and net quantity of correctable errors for each unit that contains at least one correctable error but that does not contain an uncorrectable error;
adjusting the first reference voltage by an amount based on said determining the direction and the net quantity; and
reading the data again, subsequent to said adjusting.

2. The apparatus of claim 1, wherein the data comprises a page of data, and each of the units comprises a sector of data within the page.

3. The apparatus of claim 1, wherein the operation of determining a direction and net quantity comprises determining a difference between a number of decreasing value errors and a number of increasing value errors for a particular unit.

4. The apparatus of claim 1, wherein the non-volatile memory comprises multiple-bits-per-cell technology, and the operation of adjusting comprises adjusting a second reference voltage.

5. The apparatus of claim 1, further comprising a processor coupled to the NV memory controller.

6. The apparatus of claim 1, further comprising the memory array coupled to the memory controller.

7. The apparatus of claim 6, wherein the memory array comprises a flash memory array.

8. The apparatus of claim 6, wherein the memory array comprises a NAND flash memory array.

9. A method, comprising:
reading, from a non-volatile memory, data comprising multiple units of data, wherein said reading comprises using a first reference voltage;
performing an error checking and correction process on the data;
determining that at least one of the units contains an uncorrectable error;
determining a direction and net quantity of correctable errors for each unit not containing an uncorrectable error but containing at least one correctable error;
adjusting the first reference voltage by an amount based on said determining the direction and the net quantity; and
reading the data again, subsequent to said adjusting.

10. The method of claim 9, wherein said reading the data comprises reading a page of data, and each of said units comprises a sector of data within the page.

11. The method of claim 9, wherein said determining a direction and net quantity comprises determining a difference between a number of decreasing value errors and a number of increasing value errors for a particular unit.

12. The method of claim 9, wherein the non-volatile memory comprises multiple-bits-per-cell technology, and said adjusting comprises adjusting a second reference voltage.

13. The method of claim 9, further comprising:
saving, after said reading, a first set of data comprising corrected data from the units not containing the uncorrectable errors;
saving, after said reading again, a second set of data comprising corrected data from the unit that contained the uncorrectable errors after said reading; and
combining the first set of data with the second set of data.

14. The method of claim 9, wherein said determining the direction and net quantity comprises considering a difference between all correctable increasing value errors and all correctable decreasing value errors in the data.

15. The method of claim 9, wherein said determining the direction and net quantity comprises considering an average per unit of a difference between the correctable increasing and decreasing value errors in each unit.

16. An article comprising
a tangible computer-readable medium that contains instructions, which when executed by one or more processors result in performing operations comprising:
reading, from a non-volatile memory, data comprising multiple units of data, wherein said reading comprises using a first reference voltage;
performing an error checking and correction process on the data;
determining that at least one of the units contains an uncorrectable error;
determining a direction and net quantity of correctable errors for each unit not containing an uncorrectable error but containing at least one correctable error;
adjusting the first reference voltage by an amount based on said determining the direction and the net quantity; and
reading the data again, subsequent to said adjusting.

17. The article of claim 16, wherein the operation of reading the data comprises reading a page of data, and each of said units comprises a sector of data within the page.

18. The article of claim 16, wherein the operation of determining a direction and net quantity comprises determining a difference between a number of decreasing value errors and a number of increasing value errors for a particular unit.

19. The article of claim 16, wherein the non-volatile memory comprises multiple-bits-per-cell technology, and the operation of adjusting comprises adjusting a second reference voltage.

20. The article of claim 16, wherein the operations further comprise:
saving, after said reading, a first set of data comprising corrected data from the units not containing the uncorrectable errors;
saving, after said reading again, a second set of data comprising corrected data from the unit that contained the uncorrectable errors after said reading; and
combining the first set of data with the second set of data.

21. The article of claim 16, wherein the operation of determining the direction and net quantity comprises considering a difference between all correctable increasing value errors and all correctable decreasing value errors in the data.

22. The article of claim 16, wherein the operation of determining the direction and net quantity comprises considering an average per unit of a difference between the correctable increasing and decreasing value errors in each unit.

* * * * *